(12) United States Patent
Uchida

(10) Patent No.: US 7,839,912 B2
(45) Date of Patent: Nov. 23, 2010

(54) SURFACE EMITTING LASER, SURFACE EMITTING LASER ARRAY, AND IMAGE FORMING APPARATUS USING SURFACE EMITTING LASER ARRAY

(75) Inventor: Tatsuro Uchida, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 115 days.

(21) Appl. No.: 12/040,264

(22) Filed: Feb. 29, 2008

(65) Prior Publication Data

US 2008/0304532 A1 Dec. 11, 2008

(30) Foreign Application Priority Data

Mar. 1, 2007 (JP) .............................. 2007-051939

(51) Int. Cl.
*H01S 5/00* (2006.01)
(52) U.S. Cl. ............................... 372/50.124; 372/43.01
(58) Field of Classification Search ............ 372/50.124, 372/43.01
See application file for complete search history.

(56) References Cited

U.S. PATENT DOCUMENTS 7,295,745 B2 11/2007 Uchida ....................... 385/129

2007/0201527 A1* 8/2007 Hori et al. .............. 372/50.124
2008/0031297 A1 2/2008 Uchida ..................... 372/45.01

FOREIGN PATENT DOCUMENTS

| JP | 2004-0636657 | * | 2/2004 |
| JP | 2004063657 | | 2/2004 |
| WO | 2004105094 | | 12/2004 |

* cited by examiner

*Primary Examiner*—Minsun Harvey
*Assistant Examiner*—Tuan N. Nguyen
(74) *Attorney, Agent, or Firm*—Fitzpatrick, Cella, Harper & Scinto

(57) ABSTRACT

Provided is a surface emitting laser in which a reflector material is not limited, a film thickness of the reflector is uniform, and a single lateral mode operation can be performed at high light output power. The surface emitting laser includes a resonator including a first refractive index region located at a central portion thereof and a second refractive index region which is located at a peripheral portion thereof and is lower in effective refractive index than the first refractive index region. Further, the resonator is configured such that a resonator length of a region including the first refractive index region satisfies a resonance condition and a resonator length of a region including the second refractive index region does not satisfy the resonance condition.

5 Claims, 8 Drawing Sheets

SURFACE EMITTING LASER, SURFACE EMITTING LASER ARRAY, AND IMAGE FORMING APPARATUS USING SURFACE EMITTING LASER ARRAY

BACKGROUND OF THE INVENTION

1. Field of the Invention

The present invention relates to a surface emitting laser, a surface emitting laser array, and an image forming apparatus using the surface emitting laser array.

2. Description of the Related Art

A vertical cavity surface emitting laser (VCSEL) is a laser for emitting a laser beam in a direction perpendicular to the in-plane direction of a semiconductor substrate.

A Distributed Bragg Reflector (DBR) is normally used as a reflecting layer of the surface emitting laser. The DBR is generally formed by alternately stacking a high-refractive index layer and a low-refractive index layer at an optical film thickness of $\lambda/4$.

The surface emitting laser has excellent characteristics in which a stable single mode is obtained as a longitudinal mode, a threshold value thereof is lower than a threshold value of an edge emitting laser, and a two-dimensional array is easily formed. Therefore, applications of the surface emitting laser are expected as a light source for optical communication and light transmission and a light source for electrophotography.

It is important for the surface emitting laser to control a lateral mode of oscillation. When the surface emitting laser is applied to optical communications, a desirable lateral mode output is the single mode. Therefore, in the case of the surface emitting laser, a current confinement structure is provided by selective oxidation in an inner portion of the laser to limit a light emitting region of an active layer. Simultaneously, a wave guiding structure is formed on a selectively oxidized portion for the single lateral mode.

However, when a single lateral mode oscillation is to be performed by only this method, it is necessary to reduce an oxide confinement diameter. When the oxidation confinement diameter reduces, the light emitting region becomes narrower, so it is difficult to obtain a large laser output power.

Therefore, according to Japanese Patent Application Laid-Open No. 2004-063657, there is proposed a structure in which a fundamental mode satisfies a resonance condition and a high-order mode does not satisfy the resonance condition, thereby realizing the single lateral mode at high output power.

FIG. 8 illustrates a surface emitting laser described in Japanese Patent Application Laid-Open No. 2004-063657. A bottom DBR 1020 made of a semiconductor is formed on a substrate 1010. A clad layer 1030 is formed on the bottom DBR 1020. The clad layer 1030 includes an oxide confinement structure which has an active layer 1035, an oxidized region 1040, and a non-oxidized region 1050. An etching stop layer 1060 and a contact layer 1070 are formed on the clad layer 1030. A top DBR 1080 made of a dielectric is provided to a central region of a mesa structure.

The surface emitting laser has characteristics in which a resonator length between the top DBR 1080 and the bottom DBR 1020 in the central region is different from a resonator length therebetween in a peripheral region. That is, a thickness 1090 of the central region which is a fundamental mode selection region is $N\lambda/2n$ (N: integer, $\lambda$: oscillation wavelength, n: effective refractive index in medium). In contrast, a thickness 1100 of the peripheral region which is a high-order mode oscillation suppression region is $N\lambda/2n+\lambda/4n$.

As described above, when the layer thickness is changed between the fundamental mode selection region and the high-order mode oscillation suppression region, only the fundamental mode selection region satisfies the resonance condition, with the result that the single mode oscillation is obtained.

In the structure of the laser disclosed in Japanese Patent Application Laid-Open No. 2004-063657 as described above, the physical thickness is changed between the fundamental mode selection region and the high-order mode oscillation suppression region and the top DBR 1080 is formed on such regions.

However, according to the structure disclosed in Japanese Patent Application Laid-Open No. 2004-063657, the fundamental mode selection region and the high-order mode oscillation suppression region are different from each other in film thickness by $\lambda/4n$, so it is difficult to stack the top DBR 1080 on such regions. That is, because the top DBR 1080 is formed on such an uneven surface region, it is difficult to make the film thickness of the DBR uniform. As a result, it is difficult to obtain a desired reflectance.

In particular, it is difficult to form, on the uneven surface region, a film made of a semiconductor material to which a current is easily injected, to produce the DBR.

SUMMARY OF THE INVENTION

Therefore, the present invention has been made in view of the problem and an object of the present invention is to provide a surface emitting laser in which a reflector material is not limited, a reflector whose film thickness is uniform can be formed, and a single lateral mode operation can be performed at high light output power.

In addition, an object of the present invention is to provide a surface emitting laser array in which lasers, each of which is the above-mentioned surface emitting laser, are arrayed, and an image forming apparatus which uses the surface emitting laser array and can perform high-speed high-definition printing.

According to the present invention, the surface emitting laser can be realized in which the reflector material is not easily limited, the reflector whose film thickness is uniform can be formed, and the single lateral mode operation can be performed at high light output power.

In addition, according to the present invention, the surface emitting laser array can be realized in which the reflector material is not limited, the reflector whose film thickness is uniform can be formed, and the single lateral mode operation can be performed at high light output power.

In addition, according to the present invention, the image forming apparatus capable of performing high-speed high-definition printing can be obtained.

Further features of the present invention will become apparent from the following description of exemplary embodiments with reference to the attached drawings.

DESCRIPTION OF THE EMBODIMENTS

Hereinafter, a surface emitting laser according to an embodiment of the present invention will be described. The surface emitting laser includes a resonator, a first reflector, and a second reflector, which are formed on a substrate. The resonator includes an active region and a current confinement region.

Figure 3:
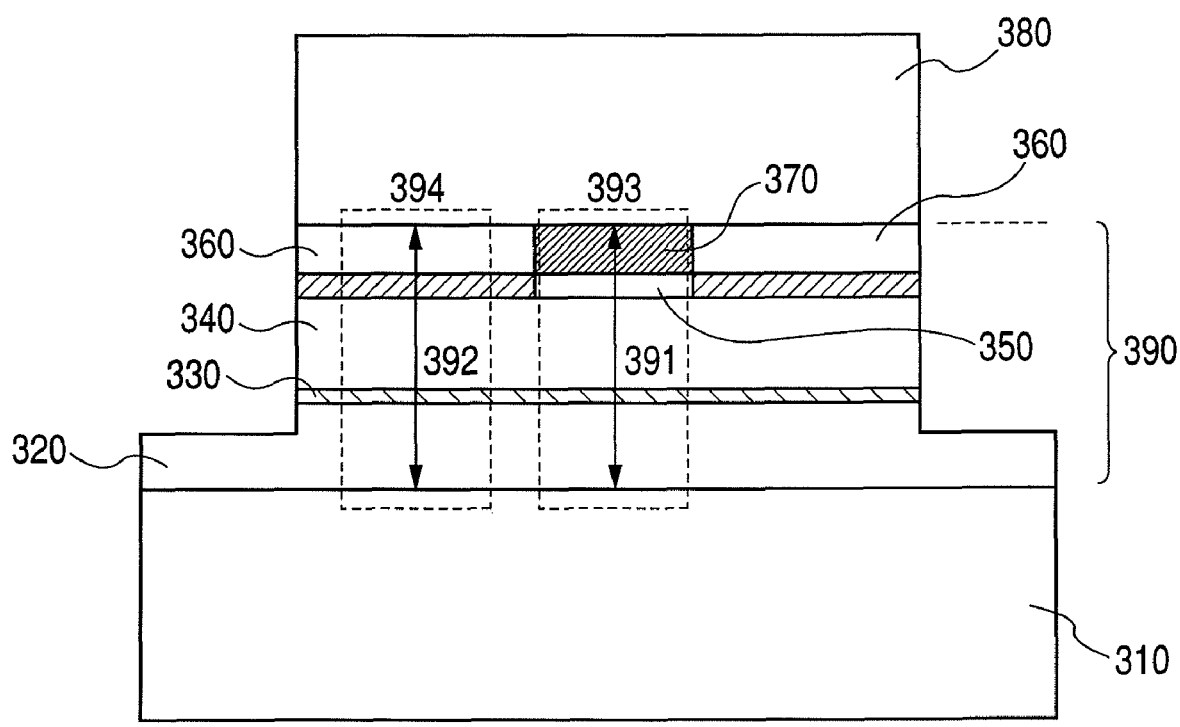
FIG. 3 is a schematic explanatory view illustrating an embodiment of the present invention.

FIG. 3 is a schematic view illustrating the surface emitting laser according to the present invention. The surface emitting laser includes a resonator, a bottom DBR 310 serving as the first reflector, and a top DBR 380 serving as the second reflector. The resonator has a resonator length indicated by reference numeral 390.

The resonator includes a bottom clad layer 320, an active layer 330 serving as the active region, a top clad layer 340, and a current confinement region 350. The resonator further includes a high-refractive index region (first refractive index region) 370 provided in the central portion thereof and a low-refractive index region (second refractive index region) 360 which is provided in the peripheral region and has an effective refractive index lower than in the central portion.

A resonator length $I_1$ (reference numeral 391) of a fundamental mode selection region 393 including the first refractive index region is set to $N\lambda/(2n_h)$. Therefore, the fundamental mode selection region 393 is designed to satisfy a resonance condition. Note that N indicates an integer, $\lambda$ indicates an oscillation wavelength, and $n_h$ indicates an effective refractive index of the fundamental mode selection region 393.

A high-order mode oscillation suppression region 394 has a resonator length $I_2$ (reference numeral 392) and includes the second refractive index region 360. The resonator length $I_2$ (reference numeral 392) is equal in physical length to the resonator length $I_1$ (reference numeral 391). However, the high-order mode oscillation suppression region 394 is different in effective refractive index from the fundamental mode selection region 393. As a result, the high-order mode oscillation suppression region 394 does not satisfy the resonance condition.

The surface emitting laser described in Japanese Patent Application Laid-Open No. 2004-063657 is designed such that the physical length is changed between the central portion and the peripheral portion to prevent the resonance condition from being satisfied. In contrast, according to the embodiment of the present invention, the surface emitting laser is designed such that the effective refractive index is changed to prevent the resonance condition from being satisfied.

The low-refractive index region can be made of a material having lower refractive index than a material of the high-refractive index region.

The low-refractive index region can be also formed by processing the high-refractive index region. For example, when holes are formed in the high-refractive index region, a material lower in refractive index than a semiconductor material such as air is introduced into the holes, so the effective refractive index can be reduced. The holes can have various shapes such as a circular shape, a triangular shape, and a rectangular shape. The low-refractive index region and the high-refractive index region may be formed on a top or bottom portion of the current confinement region. The low-refractive index region and the high-refractive index region may be formed on a top or bottom portion of the active region.

According this embodiment, the above-mentioned structure is employed, so the high-order mode oscillation can be suppressed. Therefore, it is possible to realize a surface emitting laser capable of performing the single lateral mode operation at high light output power.

The uneven surface region as described in the conventional example is not formed, so the film thickness of the reflector can be made uniform. As a result, a surface emitting laser including a reflector having a desired reflectance can be realized.

The DBR corresponding to the semiconductor layer can be formed without limiting a material of the reflector. As a result, it is possible to realize a surface emitting laser in which a carrier path formed by current injection is not limited.

When a surface emitting laser array in which m×n lasers (m, n: natural number), each of which is the surface emitting laser having the structure as described above, are arranged is produced, the material of the reflector is not limited and a reflector having a uniform film thickness can be formed. It is also possible to realize a surface emitting laser array capable of performing the single lateral mode operation at high light output power.

When an electrophotographic recording type image forming apparatus in which the surface emitting laser array having the structure as described above is contained is produced, an image forming apparatus capable of performing high-speed high-definition printing can be realized.

When the following structure is employed, the single mode oscillation can be most effectively obtained. In other words, the single mode oscillation is achieved by substituting a thickness $\lambda/4n_l$ for a thickness $\lambda/2n_h$ of the resonator length of the high-order mode oscillation suppression region. The fundamental mode selection region and the high-order mode oscillation suppression region can be designed such that the resonator lengths $I_1$ and $I_2$ respectively including the fundamental mode selection region and the high-order mode oscillation suppression region satisfy the following conditional expressions:

$$I_1 = I_2 \quad (1)$$

$$I_1 = N\lambda/(2n_h) \quad (2)$$

$$I_2 = (N-1)\lambda/2n_h + \lambda/4n_l \quad (3)$$

N: integer equal to or larger than two where $\lambda$ indicates an oscillation wavelength, $n_h$ indicates the effective refractive index of the fundamental mode selection region, and $n_l$ indicates the effective refractive index of the high-order mode oscillation suppression region.

According to the structure as described above, the highest reflectance can be obtained in the fundamental mode selection region. In contrast, the reflectance in the high-order mode oscillation suppression region can be minimized as compared with the fundamental mode selection region. As a result, when the conditional expressions are satisfied, the single mode oscillation can be most effectively obtained.

Even when a thickness $M\lambda/2n_h$ (where $N-M \geqq 2$) of the resonator length of the high-order mode oscillation suppression region is substituted by an odd multiple of the thickness $\lambda/4n_l$ in addition to the conditional expressions, the reflectance in the high-order mode oscillation suppression region can be reduced to a value lower than the reflectance in the fundamental mode selection region. Note that $N-M \geqq 2$ and $n_h > n_l > 1.5$.

For example, when $N=6$ and $n_h=3.4$, the following six conditional expressions are expected.

$I_2 = 5\lambda/2n_h + \lambda/4n_l$ (where $n_l=1.7$)

$I_2 = 4\lambda/2n_h + 3\lambda/4n_l$ (where $n_l=2.55$)

$I_2 = 3\lambda/2n_h + 3\times/4n_l$ (where $n_l=1.7$)

$I_2 = 3\lambda/2n_h + 5\lambda/4n_l$ (where $n_l=2.83$)

$I_2 = 2\lambda/2n_h + 5\lambda/4n_l$ (where $n_l=2.125$)

$I_2 = 2\lambda/2n_h + 7\lambda/4n_l$ (where $n_l=2.975$)

Note that high-order mode oscillation suppression region is a region having a structure for relatively reducing an effective reflectance in a high-order mode.

EXAMPLES

Hereinafter, examples of the present invention will be described.

Example 1

In Example 1, a surface emitting laser whose low-refractive index region is provided by the formation of holes will be described.

Figure 1:
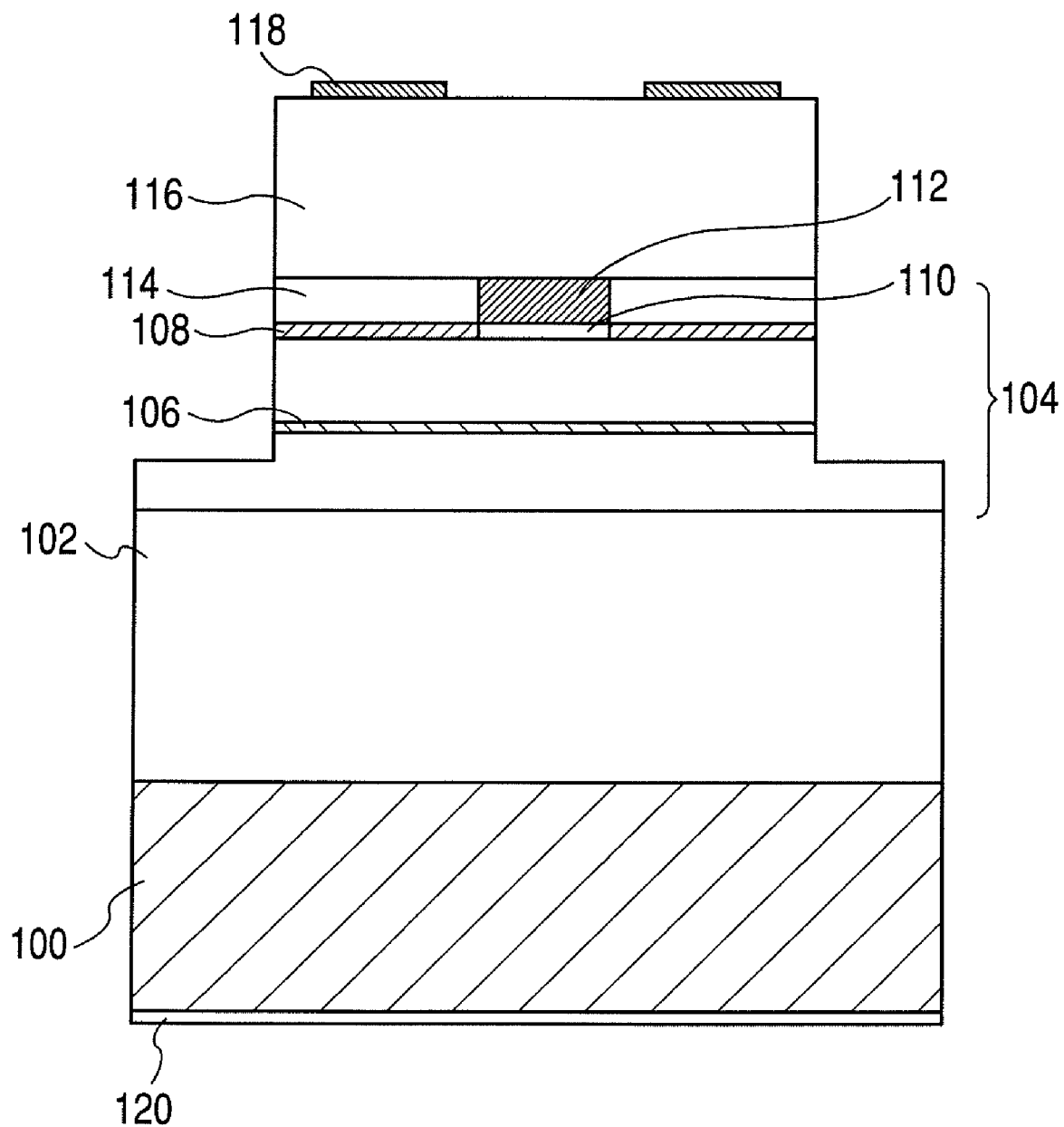
FIG. 1 is a schematic explanatory view illustrating a surface emitting laser according to Example 1 of the present invention.

FIG. 1 is a schematic explanatory view illustrating the surface emitting laser according to this example. In FIG. 1, reference numeral 100 denotes a n-type GaAs substrate, reference numeral 102 denotes a bottom DBR (n-type semiconductor multilayer film) serving as a first reflector, reference numeral 104 denotes a resonator, and reference numeral 106 denotes a quantum well active layer.

Reference numeral 108 denotes an oxidation confinement layer, reference numeral 110 denotes a current pass region, reference numeral 112 denotes a high-refractive index region, reference numeral 114 denotes a low-refractive index region, reference numeral 116 denotes a top DBR (p-type semiconductor multilayer film) serving as a second reflector, reference numeral 118 denotes a n-side electrode, and reference numeral 120 denotes a p-type electrode.

In this example, a part of an $Al_{0.3}Ga_{0.7}As$ layer serving as a top clad layer is processed to form a p-type $Al_{0.3}Ga_{0.7}As$ layer which is reduced in refractive index and is lower in effective refractive index than an unprocessed part thereof. Therefore, the surface emitting laser having the resonator 104 which includes the high-refractive index region 112 and the low-refractive index region 114 is obtained.

Next, a method of manufacturing the surface emitting laser according to this example will be described.

Figure 2A:
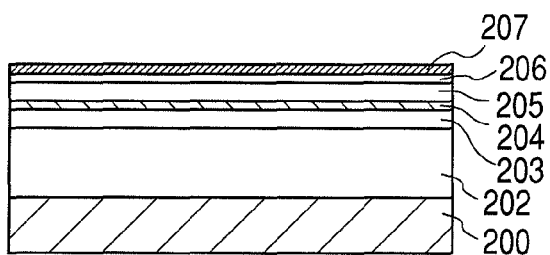
FIGS. 2A, 2B, 2C, 2D, 2E and 2F are schematic explanatory views illustrating a method of manufacturing the surface emitting laser according to Example 1 of the present invention.

FIGS. 2A to 2F are schematic explanatory views illustrating the method of manufacturing the surface emitting laser according to this example. As illustrated in FIG. 2A, respective layers are successively grown as follows on a n-type GaAs substrate 200 through a buffer layer by a MOCVD apparatus.

First, a n-type $Al_{0.9}Ga_{0.1}As/Al_{0.12}Ga_{0.88}As$-bottom DBR layer (first reflector) 202 is grown.

Next, a n-type $Al_{0.3}Ga_{0.7}As$ clad layer 203, a GaAs/$Al_{0.3}Ga_{0.7}As$-MQW active layer 204, and a p-type $Al_{0.3}Ga_{0.7}As$ clad layer 205 are grown. Then, a p-type $Al_{0.98}Ga_{0.02}As$-layer 206, and a p-type $Al_{0.3}Ga_{0.7}As$ layer 207 are successively grown.

Figure 2D:
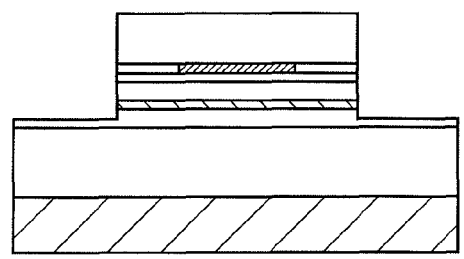
Figure 2B:
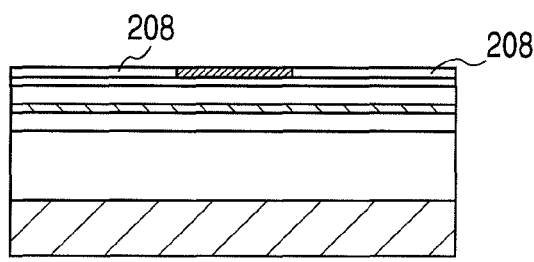
Figure 2E:
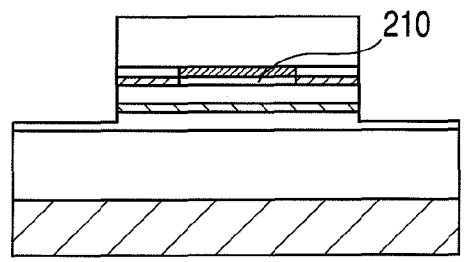
Figure 2C:
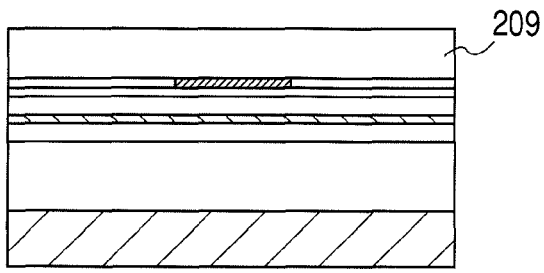

Then, as illustrated in FIG. 2B, holes are formed in a part of the p-type $Al_{0.3}Ga_{0.7}As$ layer 207 by a lithography technique and a dry etching technique to form a p-type $Al_{0.3}Ga_{0.7}As$ layer 208 whose effective refractive index is reduced to a low refractive index. As illustrated in FIG. 2C, a p-type $Al_{0.9}Ga_{0.1}As/Al_{0.12}Ga_{0.88}As$ layer (second reflector) 209 serving as a top DBR layer is grown by a MOCVD apparatus.

Then, as illustrated in FIG. 2D, a part of each of the following layers is removed by a lithography technique and a dry etching technique.

That is, a part of each of the p-type $Al_{0.9}Ga_{0.1}As/Al_{0.2}Ga_{0.88}As$-top DBR layer 209, the p-type $Al_{0.3}Ga_{0.7}As$ layer 208 whose refractive index is reduced, the p-type $Al_{0.98}Ga_{0.02}As$-layer 206, the p-type $Al_{0.3}Ga_{0.7}As$ clad layer 205, the GaAs/$Al_{0.3}Ga_{0.7}As$-MQW active layer 204, and the n-type $Al_{0.3}Ga_{0.7}As$ clad layer 203 is removed. As illustrated in FIG. 2E, the p-type $Al_{0.98}Ga_{0.02}As$-layer is selectively oxidized with steam to form a current confinement structure (current confinement region) 210.

Figure 2F:
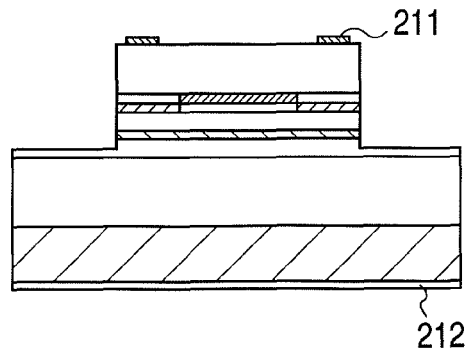

Then, as illustrated in FIG. 2F, a cathode (p-side electrode 212) and an anode (n-side electrode 211) are formed using a vapor deposition technique and a lift-off technique.

According to the process described above, the surface emitting layer in which the region which satisfies the resonance condition and the region which does not satisfy the resonance condition are formed in the resonator can be obtained.

In this example, the high-refractive index region (unprocessed part of $Al_{0.3}Ga_{0.7}As$ layer) is equal in thickness to the low-refractive index region (processed part of $Al_{0.3}Ga_{0.7}As$ layer). In this example, as illustrated in FIG. 3, a structural relationship of each of a resonator region including the high-refractive index region 300 and a resonator region including the low-refractive index region 302 is as follows.

In the resonator region including the high-refractive index region, the resonator length $I_1$ is expressed as follows.

$I_1 = 2.5\lambda/n_h$

In the resonator region including the low-refractive index region, the resonator length $I_2$ is expressed as follows.

$I_2 = 2\lambda/n_h + \lambda/4n_l$ (where $\lambda/2n_h = \lambda/4n_l$)

When such conditional expressions are satisfied, the reflectance in the resonator region including the low-refractive index region can be minimized, which is desirable in view of a high-order mode suppression effect.

Note that $\lambda$ denotes an oscillation wavelength of the surface emitting layer. The oscillation wavelength is set to 850 nm.

Symbol $n_h$ denotes an effective refractive index of the high-refractive index region and the effective refractive index thereof is set to 3.4. Symbol $n_l$ denotes an effective refractive index of the low-refractive index region and the effective refractive index thereof is set to 1.7.

As described above, the $Al_{0.3}Ga_{0.7}As$ layer is processed to form the low-refractive index region. The following method can be used as a specific example of a method of forming the low-refractive index region.

Holes are formed in the $Al_{0.3}Ga_{0.7}As$ layer having a thickness of 125 nm by a lithography technique and a dry etching technique.

In this case, when a pore percentage of a processed part of the $Al_{0.3}Ga_{0.7}As$ layer is set to approximately 70%, a low-refractive index region whose effective refractive index is 1.7 is formed.

$N_l$=1.0 (refractive index of air)×0.7 (pore percentage)+3.4 (refractive index of $Al_{0.3}Ga_{0.7}As$ layer)×0.3=1.7

In this example, a thickness of the part of the $Al_{0.3}Ga_{0.7}As$ layer which corresponds to the low-refractive index region is set to $\lambda/2n_h=\lambda/4n_l=125$ nm and the resonator is designed such that the resonator length of the resonator region including the low-refractive index region becomes $2\lambda/n_h+\lambda/4n_l$ to minimize the reflectance.

Figure 7:
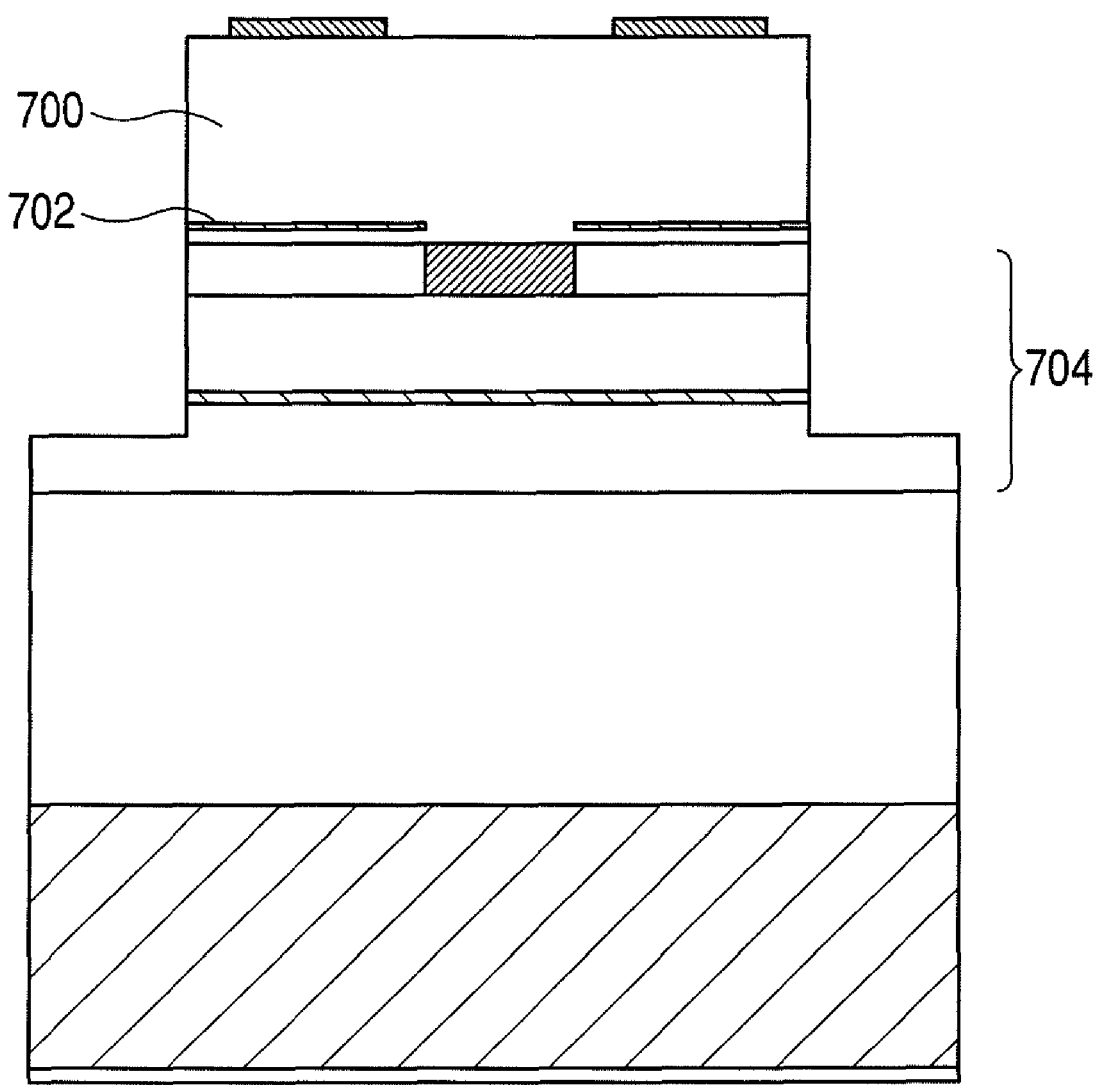
FIG. 7 is a schematic explanatory view illustrating the surface emitting laser according to Example 1 of the present invention.
Figure 8:
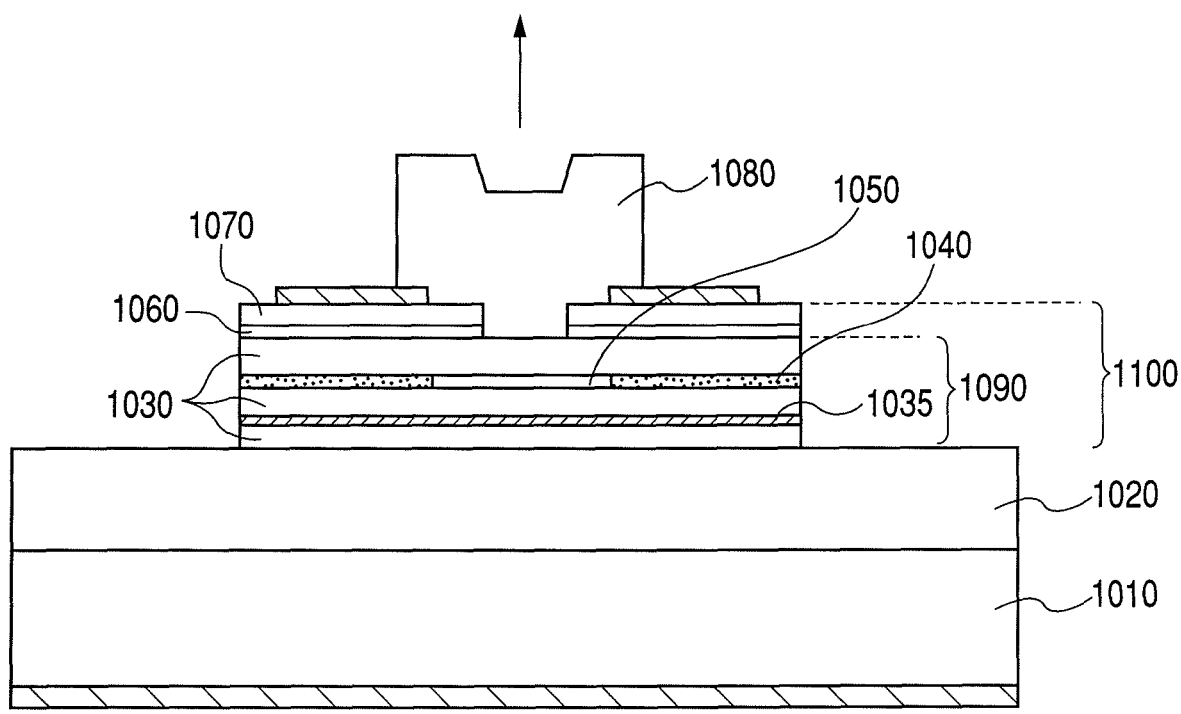
FIG. 8 is a schematic explanatory view illustrating a surface emitting laser according to a conventional technology.

The active layer is disposed at a loop of an electric field distribution and the current confinement structure is disposed at a node thereof. In this example, the current confinement structure is formed in the inner portion of the resonator. However, the present invention is not limited to such a resonator structure. A current confinement structure 702 may be formed in the inner portion of a top DBR 700 located outside a resonator 704 (see FIG. 7).

According to the structure described above, the single lateral mode operation can be performed at high light output power without narrowing the current confinement region, unlike the conventional surface emitting laser in which the current confinement region is made narrower than the active layer to realize the signal lateral mode.

When the low-refractive index region is formed wider than the current confinement region to the active layer, the single lateral mode operation can be performed at high light output power.

In this example, the surface emitting laser of 850 nm band is described. However, the present invention is not limited to such a laser and thus can be applied to a surface emitting laser of, for example, 680 nm band (GaInP/AlGaInP active layer).

The present invention is not limited to the methods (apparatuses) used for growth, lithography, etching, ashing, and vapor deposition, whish are described in this example. Any methods (apparatuses) in which the same effects can be obtained may be employed.

In this example, the surface emitting laser is described. A surface emitting laser array may be formed in which m×n (m, n: natural number) lasers, each of which is the surface emitting laser according to this example, are arranged. Therefore, the material of the reflector is not limited and a reflector having a uniform film thickness can be formed. It is possible to realize a surface emitting laser array capable of performing the single lateral mode operation at high light output power without narrowing the current confinement region.

Note that the surface emitting lasers may be arranged in one-dimensional linear array or two-dimensional array.

Example 2

In Example 2, a surface emitting laser in which a region of a resonator structure is different in material from another region thereof will be described.

Figure 4:
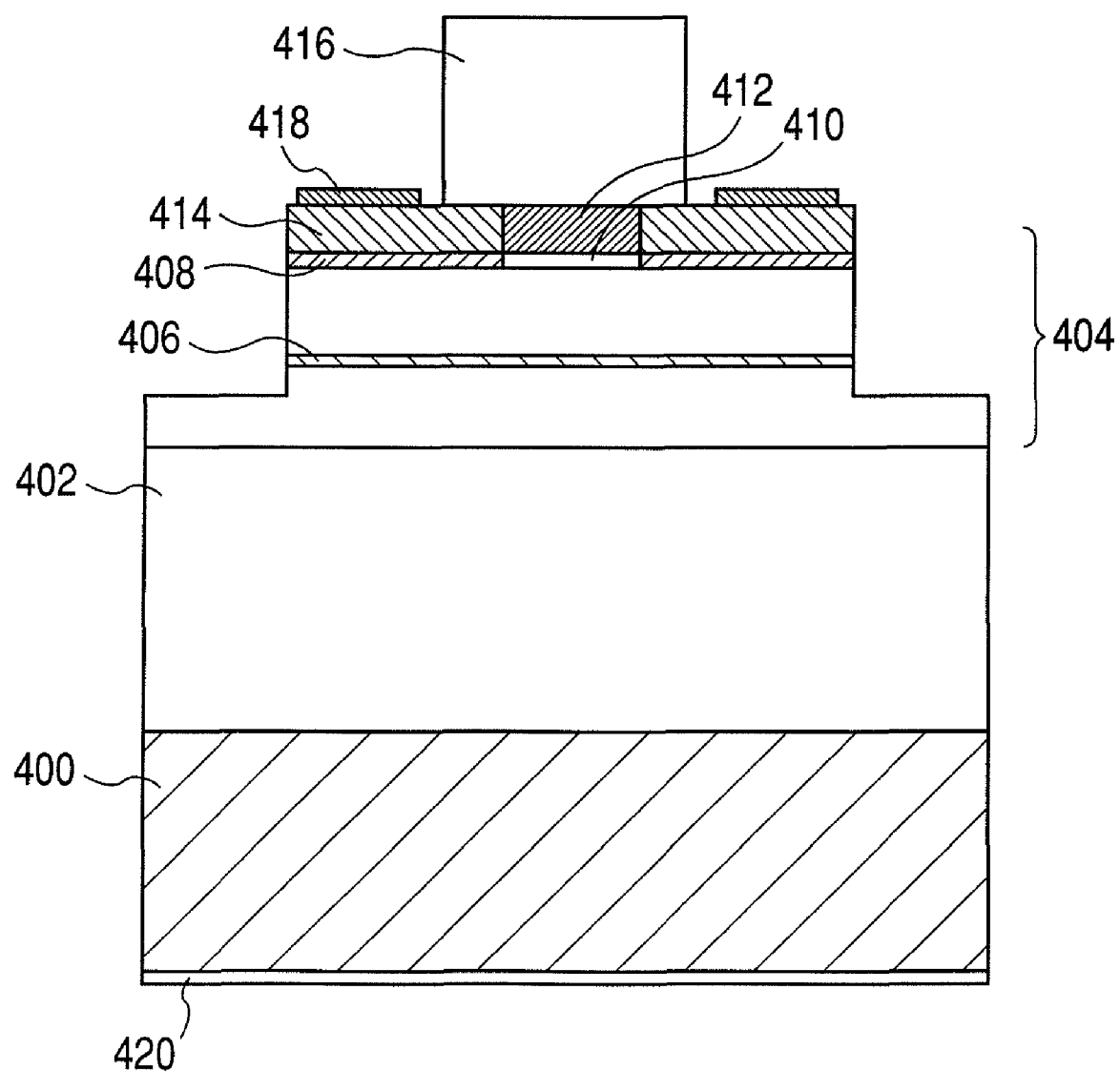
FIG. 4 is a schematic explanatory view illustrating a surface emitting laser according to Example 2 of the present invention.

FIG. 4 is a schematic explanatory view illustrating the surface emitting laser according to this example.

In FIG. 4, reference numeral 400 denotes a n-type GaAs substrate, reference numeral 402 denotes a bottom DBR (n-type semiconductor multilayer film) serving as a first reflector, reference numeral 404 denotes a resonator, and reference numeral 406 denotes a quantum well active layer.

Reference numeral 408 denotes an oxidation confinement layer, reference numeral 410 denotes a current pass region, reference numeral 412 denotes a high-refractive index region, reference numeral 414 denotes a low-refractive index region, reference numeral 416 denotes a top DBR serving as a second reflector, reference numeral 418 denotes a n-side electrode, and reference numeral 420 denotes a p-type electrode.

In this example, a part of the $Al_{0.3}Ga_{0.7}As$ layer is made different in material from another part thereof. Therefore, the surface emitting laser includes a resonator formed such that the part of the $Al_{0.3}Ga_{0.7}As$ layer becomes lower in effective refractive index than the other part thereof.

The resonator is sandwiched between the bottom DBR and the top DBR.

Next, a method of manufacturing the surface emitting laser according to this example will be described. FIG. 5 is a schematic explanatory view illustrating the method of manufacturing the surface emitting laser according to this example.

Figure 5A:
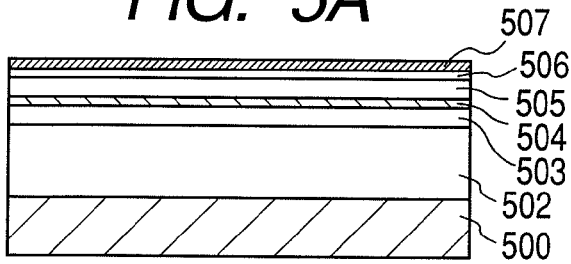
FIGS. 5A, 5B, 5C, 5D, 5E, 5F and 5G are schematic explanatory views illustrating a method of manufacturing the surface emitting laser according to Example 2 of the present invention.

As illustrated in FIG. 5A, respective layers are successively grown as follows on a n-type GaAs substrate 500 through a buffer layer by a MOCVD apparatus.

First, a n-type $Al_{0.9}Ga_{0.1}As/Al_{0.12}Ga_{0.88}As$-bottom DBR layer (first reflector) 502 is grown.

Next, a n-type $Al_{0.3}Ga_{0.7}As$ clad layer 503, a GaAs/$Al_{0.3}Ga_{0.7}As$-MQW active layer 504, and a p-type $Al_{0.3}Ga_{0.7}As$ clad layer 505 are grown.

Then, a p-type $Al_{0.98}Ga_{0.02}As$-layer 506 and a p-type $Al_{0.3}Ga_{0.7}As$ layer 507 are successively grown.

Figure 5B:
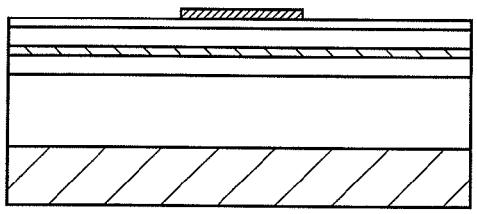

Then, as illustrated in FIG. 5B, a part of the p-type $Al_{0.3}Ga_{0.7}As$ layer 507 is removed by a lithography technique and a dry etching technique.

Figure 5C:
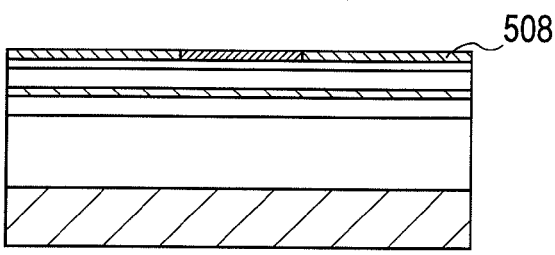
Figure 5D:
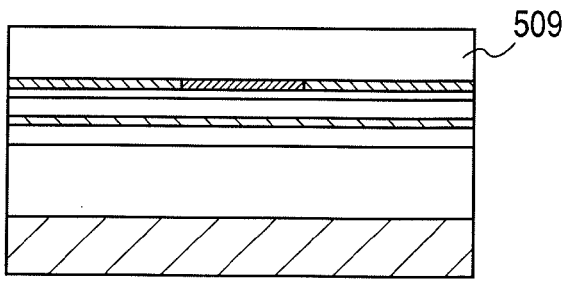

Then, as illustrated in FIG. 5C, an ITO film 508 which is lower in refractive index than the $Al_{0.3}Ga_{0.7}As$ layer is formed by a sputtering technique, a lithography technique, and a dry etching technique. As illustrated in FIG. 5D, a $SiO_2/TiO_2$ layer (second reflector) 509 serving as a top DBR layer is formed by an electron beam vapor deposition method.

Figure 5E:
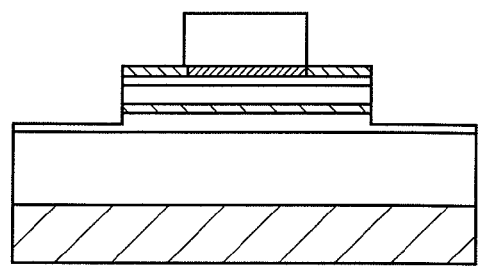
Figure 5F:
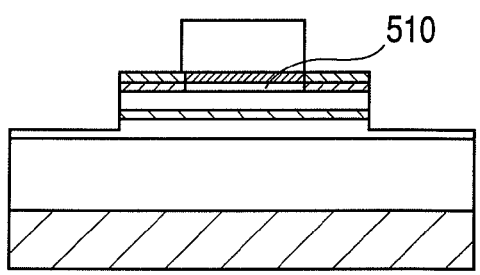

Then, as illustrated in FIG. 5E, a part of each of the top DBR layer 509, the ITO layer 508, the p-type $Al_{0.98}Ga_{0.02}As$-layer 506, the p-type $Al_{0.3}Ga_{0.7}As$ clad layer 505, the GaAs/$Al_{0.3}Ga_{0.7}As$-MQW active layer 504, and the n-type $Al_{0.3}Ga_{0.7}As$ clad layer 503 is removed by a lithography technique and a dry etching technique. As illustrated in FIG. 5F, the p-type $Al_{0.98}Ga_{0.02}As$-layer is selectively oxidized with steam to form a current confinement structure (current confinement region) 510.

Figure 5G:
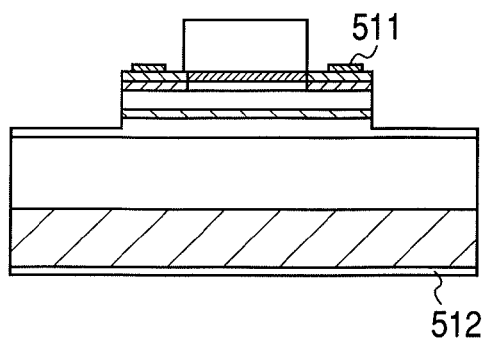

Then, as illustrated in FIG. 5G, a cathode (p-side electrode 512) and an anode (n-side electrode 511) are formed using a vapor deposition technique and a lift-off technique.

According to the process described above, the surface emitting layer in which the region which satisfies the resonance condition and the region which does not satisfy the resonance condition are formed in the resonator can be obtained.

In this example, the high-refractive index region ($Al_{0.3}Ga_{0.7}As$ region) is equal in thickness to the low-refractive index region (ITO region). Therefore, a structural relationship of each the regions of the resonator is the same as in Example 1.

According to the structure described above, the single lateral mode operation can be performed at high light output power without narrowing the current confinement region, unlike the conventional surface emitting laser in which the current confinement region is made narrower than the active layer to realize the signal lateral mode.

When the low-refractive index region is formed wider than the current confinement region to the active layer, the single lateral mode operation can be performed at high light output power.

In this example, the surface emitting laser of 850 nm band is described. However, the present invention is not limited to such a laser and thus can be applied to a surface emitting laser of, for example, 680 nm band (GaInP/AlGaInP active layer).

In this example, the ITO film is used for the low-refractive index region. However, the present invention is not limited to the ITO film.

In this example, the $SiO_2/TiO_2$ layer is used as the top DBR layer. However, the present invention is not limited to the $SiO_2/TiO_2$ layer. A material such as $SiO_2/Al_2O_3$ may be used. The present invention is not limited to the methods (apparatuses) used for growth, lithography, etching, ashing, and vapor deposition, whish are described in this example. Any methods (apparatuses) in which the same effects can be obtained may be employed.

In this example, the surface emitting laser is described. A surface emitting laser array may be formed in which m×n (m, n: natural number) lasers, each of which is the surface emitting laser according to this example, are arranged. Therefore, the material of the reflector is not limited and a reflector having a uniform film thickness can be formed. It is possible to realize a surface emitting laser array capable of performing the single lateral mode operation at high light output power without narrowing the current confinement region.

Example 3

In Example 3, an example of applications using the surface emitting laser array according to the present invention will be described.

Figure 6A:
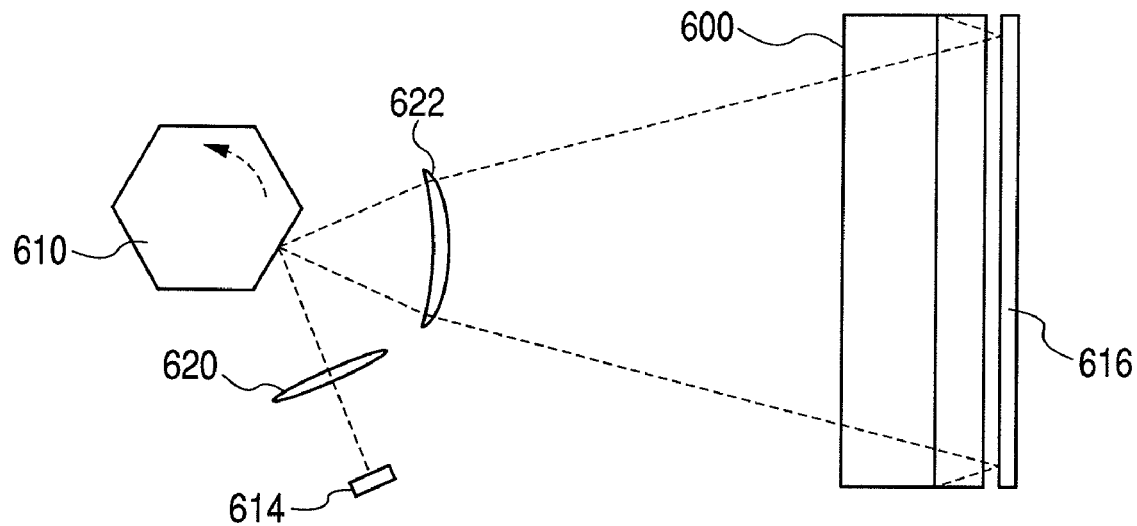
FIGS. 6A and 6B are schematic explanatory views illustrating a structure of an electrophotographic recording type image forming apparatus in which a surface emitting laser array according to Example 3 of the present invention is contained.
Figure 6B:
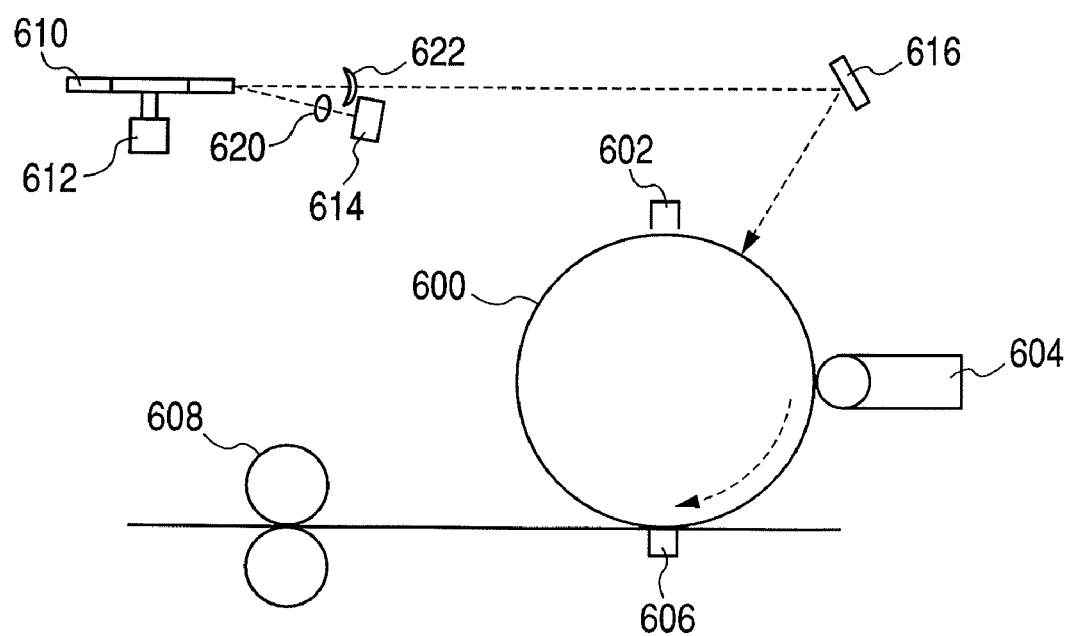

FIGS. 6A and 6B are structural views illustrating an electrophotographic recording type image forming apparatus in which the surface emitting laser array according to the present invention is contained as a light source for exposure. FIG. 6A is a side view illustrating the image forming apparatus and FIG. 6B is a side view illustrating the image forming apparatus.

In FIGS. 6A and 6B, the image forming apparatus includes a photosensitive drum 600, an electrifier 602, a developing device 604, a transferring electrifier 606, a fixing device 608, a rotary polygon mirror 610, a motor 612, a surface emitting laser array 614, a reflecting mirror 616, a collimator lens 620, and a f-θ lens 622.

In FIGS. 6A and 6B, the motor 612 is used to rotate the rotary polygon mirror 610.

In this example, the rotary polygon mirror 610 includes six reflecting surfaces. The surface emitting laser array 614 is used as a light source for exposure.

The surface emitting laser array 614 is turned on or turned off in response to an image signal by a laser driver (not shown). A laser beam which is optically modulated is emitted from the surface emitting laser array 614 toward the rotary polygon mirror 610 through the collimator lens 620.

The rotary polygon mirror 610 is rotating in a direction indicated by an arrow. The laser beam emitted from the surface emitting laser array 614 is reflected on the reflecting surfaces during the rotation of the rotary polygon mirror 610, to exit deflection beams whose exit angles are successively changed.

The reflected beam is subjected to distortion correction by the f-θ lens 622 and emitted to the photosensitive drum 600 through the reflecting mirror 616 to scan the photosensitive drum 600 in the main scanning direction.

At this time, an image of multiple lines corresponding to the surface emitting laser array 614 is formed in the main scanning direction of the photosensitive drum 600 by the reflection of beams on a reflecting surface of the rotary polygon mirror 610.

In this example, 4×8 surface emitting lasers are used for the surface emitting laser array 614, to form an image of four lines.

The photosensitive drum 600 is charged in advance by the electrifier 602 and sequentially exposed by laser beam scanning to form an electrostatic latent image.

The photosensitive drum 600 is rotating in a direction indicated by an arrow. The formed electrostatic latent image is developed by the developing device 604. A visible image obtained by developing is transferred to a transferring sheet (not shown) by the transferring electrifier 606.

The transferring sheet, to which the visible image is transferred, is conveyed to the fixing device 608 and delivered to the outside of the image forming apparatus after fixing.

A beam detect sensor (hereinafter referred to as BD sensor) (not shown) is disposed close to a scanning start position in the main scanning direction in the side portion of the photosensitive drum 600. A laser beam reflected on each of the reflecting surfaces of the rotary polygon mirror 610 is detected by the BD sensor before line scanning. A detection signal of the BD sensor is input as a scanning start reference signal for the main scanning direction to a timing controller (not shown). A writing start position of each line in the scanning direction is synchronized based on the scanning start reference signal.

In this example, the 4×8 surface emitting lasers are used for the surface emitting laser array. However, the present invention is not limited to this case and thus m×n (m, n: natural number) surface emitting lasers may be used for the surface emitting laser array.

As described above, when the surface emitting laser array according to the present invention is used for an electrophotographic recording type image forming apparatus, an image forming apparatus capable of performing high-speed high-definition printing can be obtained.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-051939, filed Mar. 1, 2007 which is hereby incorporated by reference herein its entirety.

What is claimed is:

1. A surface emitting laser comprising:
a resonator;
a first reflector; and
a second reflector,
wherein the resonator and the first and second reflectors are provided on a substrate,
wherein the resonator includes an active region and a current confinement region,
wherein the resonator includes a first refractive index region that is located at a central portion of the resonator and a second refractive index region that is located at a peripheral portion of the resonator and that is lower than the first refractive index region in effective refractive index,
wherein a resonator length $I_1$ of a first region of the resonator that includes the first refractive index region causes the first region of the resonator to satisfy a resonance condition, and a resonator length $I_2$ of a second region of the resonator that includes the second refractive index region causes the second region of the resonator not to satisfy the resonance condition, wherein the first refractive index region is equal in physical length to that of the second refractive index region, and wherein the resonator length $I_1$ of the region including the first refractive index region and the resonator length $I_2$ of the region including the second refractive index region satisfy the following conditional expressions:

$I_1 = I_2$, $I_1 = N\lambda/(2n_h)$, $I_2 = (N-1)\lambda/2n_h + \lambda/4n_l$, and $n_h > n_l$, in which N is an integer equal to or larger than two, where $\lambda$ indicates an oscillation wavelength, $n_h$ indicates an effective refractive index of a fundamental mode selection region, and $n_l$ indicates an effective refractive index of a high-order mode oscillation suppression region.

2. A surface emitting laser according to claim 1, wherein the second refractive index region is formed by processing a part of a layer which corresponds to the first refractive index region to reduce an effective refractive index of the layer.

3. A surface emitting laser according to claim 1, wherein the second refractive index region is formed by replacing a part of a layer which corresponds to the first refractive index region with a material lower in refractive index than the layer.

4. A surface emitting laser according to claim 1, wherein the surface emitting laser is one of multiple surface emitting lasers of a surface emitting laser array.

5. A surface emitting laser according to claim 4, wherein the surface emitting laser array is incorporated in an image forming apparatus as a light source for exposure.

* * * * *